US007299603B2

(12) United States Patent
Horng et al.

(10) Patent No.: US 7,299,603 B2
(45) Date of Patent: Nov. 27, 2007

(54) FRONT OPENING SHIPPING BOX AND METHOD OF OPERATING THE SAME

(75) Inventors: Jian-Ping Horng, Taipei County (TW); Cheng-Chien Lin, Taoyuan County (TW); Wen-An Lu, Miaoli County (TW); Yu-Mei Lin, Hsinchu (TW); Wu-Fu Weng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,238

(22) Filed: Mar. 14, 2006

(65) Prior Publication Data

US 2007/0214747 A1    Sep. 20, 2007

(51) Int. Cl.
*B65B 31/00* (2006.01)
*B65D 81/20* (2006.01)

(52) U.S. Cl. ............... 53/432; 53/475; 206/213.1; 206/524.8; 206/710

(58) Field of Classification Search .................. 53/432, 53/510; 206/213.1, 710–712, 524.8
See application file for complete search history.

(56) References Cited

U.S. PATENT DOCUMENTS

| | | | | |
|---|---|---|---|---|
| 3,364,688 A | * | 1/1968 | Matlow et al. ............. | 62/45.1 |
| 3,521,806 A | * | 7/1970 | Esty ......................... | 229/117.3 |
| 3,984,994 A | * | 10/1976 | Ehle et al. ................. | 62/45.1 |
| 4,627,336 A | * | 12/1986 | Nam .......................... | 99/467 |
| 4,796,676 A | * | 1/1989 | Hendershot et al. ........... | 141/83 |
| 4,888,936 A | * | 12/1989 | Takahama et al. ............ | 53/510 |
| 6,003,674 A | * | 12/1999 | Brooks ....................... | 206/711 |
| 6,351,924 B1 | * | 3/2002 | Gustafsson et al. ........... | 53/425 |

FOREIGN PATENT DOCUMENTS

JP          2-242771 A   *  9/1990

* cited by examiner

*Primary Examiner*—Stephen F Gerrity
(74) *Attorney, Agent, or Firm*—Jianq Chyun IP Office

(57) ABSTRACT

A method of operating a front opening shipping box is provided. The operating method comprises providing a front opening shipping box. The front opening shipping box includes at least a container body, at least an air extraction pipeline and at least a gas inlet pipeline. The container body has at least two openings. The air extraction pipeline is disposed on the surface of the container body and linked to the container body through one of the two openings. The gas inlet pipeline is also disposed on the surface of the container body and linked to the container body through the outer opening. Then, a number of wafers are loaded inside the container body. Next, through the air extraction pipeline and the gas inlet pipeline, air is pumped out from the inside of the container box while the gas is injected into the container body simultaneously.

9 Claims, 2 Drawing Sheets

FRONT OPENING SHIPPING BOX AND METHOD OF OPERATING THE SAME

BACKGROUND OF THE INVENTION

DESCRIPTION

1. Field of the Invention

The present invention relates to a semiconductor apparatus and operating method thereof. More particularly, the present invention relates to a front opening shipping box and method of operating the same.

2. Description of the Related Art

At present, in the semiconductor manufacturing industry, front opening unified pod (FOUP) and front opening shipping box (FOSB) are commonly used as a receptacle for carrying and transporting wafers. The front opening unified pod (FOUP) is mainly used inside a wafer fabrication plant for carrying, transporting and protecting wafers between stations or between processes. The method of operation the FOUP includes putting the wafers inside the FOUP to prevent any dust particles in the atmosphere from contaminating the wafers. When there is a need to transfer the wafers to a particular piece of processing equipment, the lid of the FOUP is opened and a robotic arm is used to snatch the wafers. Because the lid of the FOUP needs to be opened and closed a number of times to load or unload wafers, the interior of the FOUP must be kept in a high degree of cleanliness.

The front opening shipping box (FOSB) is different from the front opening unified pod (FOUP) because the FOSB mainly serves as a carrier for transporting wafers between manufacturing facilities. The wafers inside the FOSB are usually finished or semi-finished products. Furthermore, because there is no need to open/close the lid of the FOSB many times, it is unnecessary to provide a degree of cleanliness inside of the FOSB same as the high standard of the FOUP. Moreover, the FOSB often has an air hole for adjusting the pressure difference between the inside and the outside of the box so that the lid can be lifted off more easily.

However, as the integration of semiconductor devices in integrated circuits continues to increase day by day, the precision of each processing step has become increasingly critical. Therefore, if a minor error or contamination in the process of transporting wafers occurs, the wafers may be damaged and need to be thrown away or scrapped into pieces that a lot of money is wasted. In particular, special treatment is often not provided to a front opening shipping box (FOSB) before transporting it outside of a processing plant. Thus, the oxygen and moisture inside the FOSB often react with the wafers to cause wafer damage.

One solution of the aforementioned problem is to have nitrogen injected into the FOSB so that the moisture and oxygen content inside the box is reduced. However, injecting nitrogen into the FOSB directly through the air hole is infeasible because the box is full of air. In another method, air is first pumped out from the FOSB through the air hole to create a partial vacuum inside the box before injecting nitrogen into the box via the air hole. The drawback of this method is that the rapid intrusion of nitrogen into the box will lead to the formation of particle contaminants and/or damage of the wafers due to the substantial pressure difference between the inside and the outside of the box. As a result, some of the wafers may have to be scrapped resulting in an increase of the production cost.

SUMMARY OF THE INVENTION

Accordingly, at least one objective of the present invention is to provide a front opening shipping box (FOSB) that can avoid the problem of generating particle contaminants and/or damaging the wafers in the conventional method of injecting nitrogen into the FOSB through an air hole.

At least another objective of the present invention is to provide another type of front opening shipping box (FOSB) that can avoid the problem of generating particle contaminants and/or damaging the wafers in the conventional method of injecting nitrogen into the FOSB through an air hole.

At least another objective of the present invention is to provide a method of operating a front opening shipping box (FOSB) that can pump out and inject air into the box simultaneously and effectively to reduce the oxygen and moisture content inside the box. Furthermore, the method can prevent the generation of particle contaminants inside the box and reduce possible damage to the wafers.

At least yet another objective of the present invention is to provide another method of operating a front opening shipping box (FOSB) that can pump air out and inject air into the box simultaneously and effectively to reduce the oxygen and moisture content inside the box. Furthermore, the method can prevent the generation of particle contaminants inside the box and reduce possible damage to the wafers.

To achieve these and other advantages and in accordance with the purpose of the invention, as embodied and broadly described herein, the invention provides a front opening shipping box (FOSB) suitable for carrying wafers from one manufacturing plant to another. The FOSB includes at least a container body, at least an air extraction pipeline and at least a gas inlet pipeline. The container body has at least two openings. The air extraction pipeline is disposed on the surface of the container body and linked to the container body through one of the two openings. The air extraction pipeline mainly serves as a means for pumping air out of the container body. The gas inlet pipeline is also disposed on the surface of the container body and linked to the container body through the other opening. The gas inlet pipeline mainly serves as a means for injecting gas into the container body.

In one embodiment of the present invention, the distance separating the two openings is between about 1 to 45 cm.

In one embodiment of the present invention, the aforementioned gas is an insert gas. In another embodiment, the gas is nitrogen.

The present invention also provides an alternative front opening shipping box (FOSB) suitable for carrying and protecting a plurality of wafers from one manufacturing plant to another. The FOSB includes at least a container body and a concentric sleeve pipeline. The container body has at least one opening. The concentric sleeve pipeline is disposed on the surface of the container body and linked to the container body through the opening. The concentric sleeve pipeline includes an inner pipeline and an outer pipeline. The inner pipeline and the outer pipeline are used as a means for pumping air out of the container body and injecting gas into the container body.

In one embodiment of the present invention, the aforementioned gas is an inert gas. In another embodiment, the gas is nitrogen.

The present invention also provides a method of operating a front opening shipping box. The method includes first providing a front opening shipping box (FOSB). The FOSB includes a container body, at least an air extraction pipeline and at least a gas inlet pipeline. The air extraction pipeline is disposed on the surface of the container body and linked to the container body through one of the two openings. The gas inlet pipeline is also disposed on the surface of the container body and linked to the container body through the other opening. Then, a plurality of wafers is loaded into the container body. Next, through the air extraction pipeline and the gas inlet pipeline, air is pumped out from the container body while gas is injected into the container body simultaneously.

In one embodiment of the present invention, the distance separating the two openings is between about 1 to 45 cm.

In one embodiment of the present invention, the flow rate of the gas is between about 0 to 10 l/sec.

In one embodiment of the present invention, the pressure within the container body is between about −1 to 5 kg/cm$^2$.

In one embodiment of the present invention, the interval of time for injecting the gas into the container body is between 1 sec to 30 min.

In one embodiment of the present invention, the aforementioned gas is an inert gas. In another embodiment, the gas is nitrogen.

The present invention also provides an alternative method of operating a front opening shipping box. The method includes first providing a front opening shipping box (FOSB). The FOSB includes at least a container body and a concentric sleeve pipeline. The container body has at least one opening. The concentric sleeve pipeline is disposed on the surface of the container body and linked to the container body through the opening. The concentric sleeve pipeline includes an inner pipeline and an outer pipeline. Then, a plurality of wafers is loaded inside the container body. Next, through the inner pipeline and the outer pipeline of the concentric sleeve pipeline, air is pumped out from the container body while gas is injected into the container body simultaneously.

In one embodiment of the present invention, the gas flow rate is between about 0 to 10 l/sec.

In one embodiment of the present invention, the pressure inside the container body is between about −1 to 5 kg/cm$^2$.

In one embodiment of the present invention, the interval of time for injecting the gas into the container body is between about 1 sec to 30 min.

In one embodiment of the present invention, the aforementioned gas is an inert gas. In another embodiment, the gas is nitrogen.

The FOSB and method of operating the same in the present invention utilizes an air extraction and a gas injection pipe elements including the air extraction pipeline and the gas inlet pipeline or the concentric sleeve pipeline to draw air out of the box and inject gas back in simultaneously. In this way, the difference in pressure between the outside and the inside of the FOSB is almost equalized. Without the need to create a partial vacuum by pumping air out before injecting gas in as in the conventional method, problems including particle contaminants and/or damage of the wafers, and/or the inability of injecting gas into the container body can be avoided. Furthermore, the FOSB and the method of operating the FOSB according to the present invention can significantly reduce the oxygen and moisture content inside the box. In other words, the change of having to throw away the wafers due to oxidation and corrosion inside the box is substantially reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
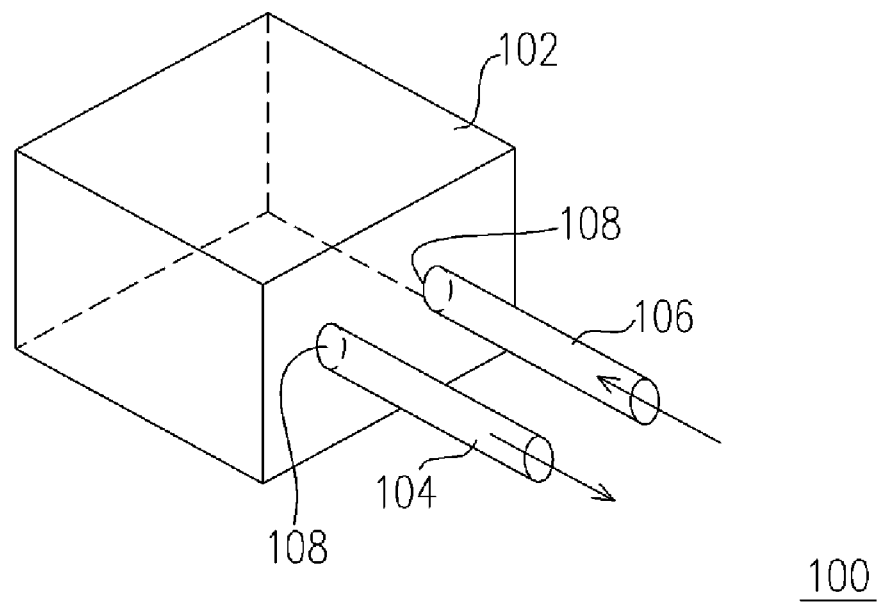
FIG. 1 is a perspective view of a front opening shipping box according to one embodiment of the present invention.

Reference will be made in detail to the present preferred embodiments of the invention, examples of which are illustrated in the accompanying drawings. Wherever possible, the same reference numbers are used in the drawings and the description to refer to the same or like parts.

Figure 2:
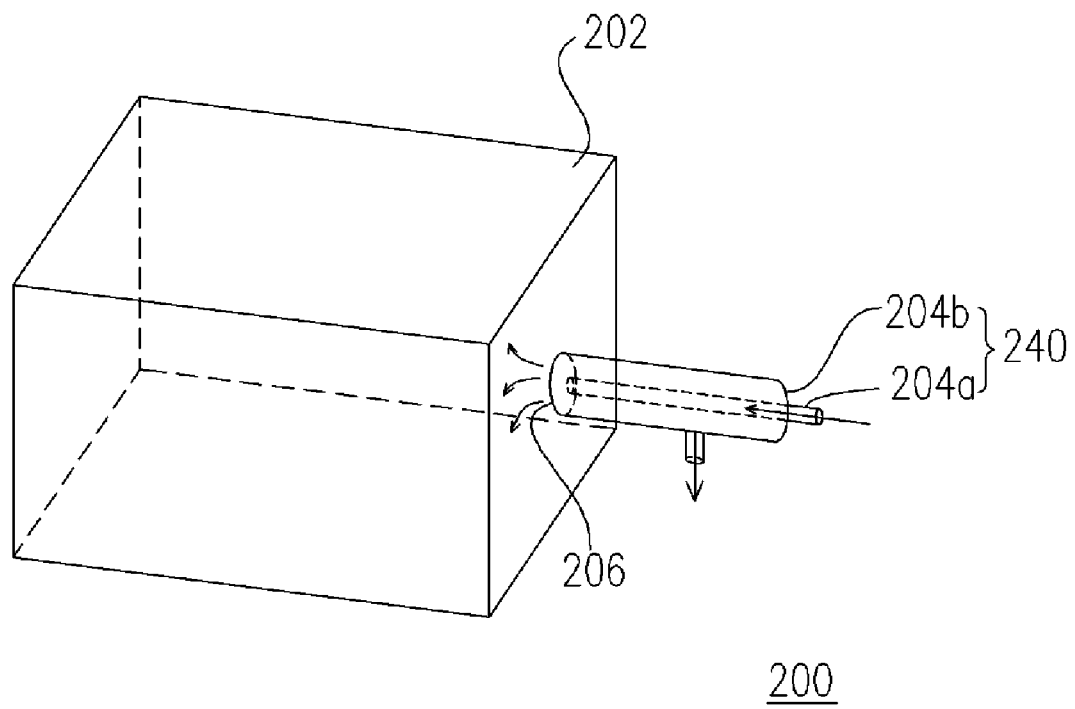
FIG. 2 is a perspective view of a front opening shipping box according to another embodiment of the present invention.

The front opening shipping box (FOSB) in the present invention differs from a front opening unified pod (FOUP). The FOSB is mainly used as a carrier for transporting wafers from one plant facility to another. FIG. 1 is a perspective view of a front opening shipping box according to one embodiment of the present invention. FIG. 2 is a perspective view of a front opening shipping box according to another embodiment of the present invention.

As shown in FIG. 1, the front opening shipping box (FOSB) 100 in the present invention includes at least a container body 102, an air extraction pipeline 104 and a gas inlet pipeline 106. The container body 102 has two openings 108. In the present embodiment, only two openings are used for illustration purpose. In practice, there is no particular limitation on the number of openings. One of the two openings 108 can serve as a gas outlet while the other can serve as a gas inlet. In one embodiment, the distance d separating the two openings 108 is between about 1 to 45 cm, for example.

The air extraction pipeline 104 is disposed on the surface of the container body 102 and linked to the container body 102 through one of the openings 108. Air can be pumped out of the container body 102 by means of the air extraction pipeline 104. The gas inlet pipeline 106 is also disposed on the surface of the container body 102 and linked to the container body 102 through the outer opening 108. Gas can be injected into the container body 102 by means of the gas inlet pipeline 106. The gas injected into the container body 102 can be nitrogen or one of the inert gases including helium, neon, argon, krypton, xenon or radon, for example.

As shown in FIG. 2, the front opening shipping box (FOSB) 200 in the present invention includes at least a container body 202 and a concentric sleeve piping 204. The FOSP 200 has an opening 206. In the present embodiment, only one opening 206 is illustrated in the drawing. However, the present invention sets no particular limit to the number of openings that can be used.

The concentric sleeve pipeline 204 is disposed on the surface of the container body 202 and linked to the container body 202 through the opening 206. The aforementioned concentric sleeve pipeline 204 includes an inner pipeline 204a and an outer pipeline 204b. The inner pipeline 204a and the outer pipeline 204b are used for pumping air out of the container body 202 and injecting gas back into the container body 202. The gas injected into the container body 202 can be nitrogen or inert gas selected from a group consisting of helium, neon, argon, krypton, xenon and radon. In the present embodiment, the inner pipeline 204a serves as a medium for injecting gas into the container body 202 and the outer pipeline 204b serves as a medium for pumping air out of the container body 202. Obviously, the present invention is not limited as such. The outer pipeline 204b can be used for injecting gas into the container body 202 and the inner pipeline 204a can be used for withdrawing air from the container body 202.

Figure 3:
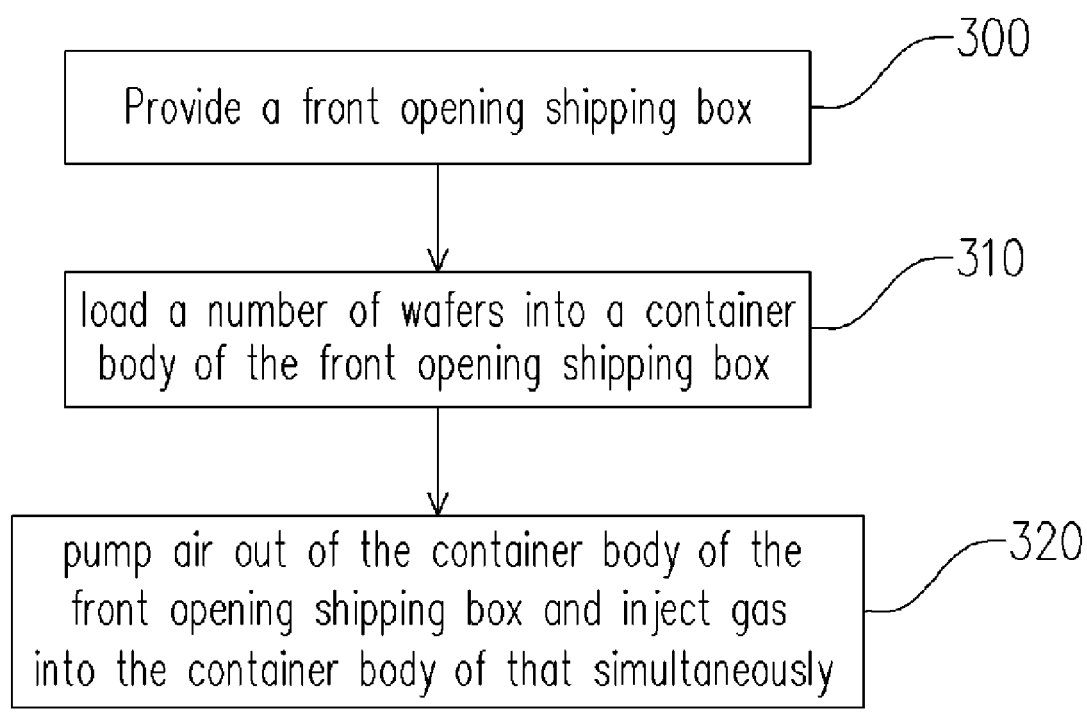
FIG. 3 is a flowchart showing the steps for operating a front opening shipping box according to the present invention.

In the following, a method of operating the front opening shipping box (FOSB) is described. FIG. 3 is a flowchart showing the steps for operating a front opening shipping box according to the present invention.

As shown in FIGS. 1, 2 and 3, the method of operating the FOSB includes the following steps. First, in step 300, a front opening shipping box (FOSB) is provided. The FOSB particularly refers to the FOSB of the present invention. Since the structure of this FOSB has been described in the foregoing embodiments, a detailed explanation is omitted here.

In step 310, a plurality of wafers is loaded into the container body of the FOSB. This step involves loading finished or semi-finished wafer products inside the container body so that the wafers can be transported from one manufacturing facility to another without causing any damage.

In step 320, the air inside the container body of the FOSB is pumped out and a gas is injected into the container body simultaneously. The gas injected into the container body is nitrogen or an inert gas selected from a group consisting of helium, neon, argon, krypton, xenon and radon, for example. The flow rate of the gas injecting into the container body is between about 0 to 10 1/sec. The pressure inside the container body is between about $-1$ to $5$ $kg/cm^2$. The interval of time for the passage of the gas into the container body is between about 1 sec to 30 min. This step can provide a pressure balance between the pressure inside the FOSB and the external pressure. As a result, the present invention is able to prevent the formation of particle contaminants or the problem of damaging the wafer or even the difficulty of injecting the gas into the container body as the conventional method requires creating a vacuum environment before injecting gas into FOSB.

Using FIG. 1 as an example, the aforementioned step includes loading wafers (not shown) into the FOSB 100. Then, the air inside the container body 102 is pumped out through the air extraction pipeline 104 and an inert gas or nitrogen is injected into the container body 102 through the gas inlet pipeline 106 simultaneously. Using FIG. 2 as an example, the aforementioned step includes loading wafers (not shown) into the FOSB 200. Then, the air inside the container body 202 is pumped out through the outer pipeline 204b of the concentric sleeve pipeline 204 and an inert gas or nitrogen is injected into the container body 202 through the inner pipeline 204a of the concentric sleeve pipeline 204 simultaneously.

Accordingly, the front opening shipping box (FOSB) and the method of operating the FOSB in the present invention utilizes the pipe elements on the FOSB such as the air extraction pipeline and the gas inlet pipeline or the concentric sleeve pipeline to simultaneously pump air out of the container body and inject gas into the container body. In this way, the pressure difference between the inside of the FOSB and the outside of the FOSB is maintained in a balanced state. As a result, the present invention is able to prevent the creation of particle contaminants or the problem of damaging the wafer or even the difficulty of injecting the gas into the container body as the conventional method requires creating a vacuum environment before injecting gas into the FOSB.

On the other hand, the passage of an inert gas or nitrogen into the container body in the FOSB and the method of operating the FOSB in the present invention provides a very effective means of lowering the oxygen and moisture content inside the container body. Thus, the oxidation and corroding reaction of the wafers loaded inside the container body with oxygen and moisture is substantially minimized. Accordingly, the problem of wafers being scrapped into pieces due to oxidation or corrosion can be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A front opening shipping box (FOSB) carrying a number of wafers from one manufacturing facility to another, the front opening shipping bus comprising:
    a container body having at least an opening thereon; and
    at least a concentric sleeve pipeline disposed on the surface of the container body and linked to the container body through the opening, wherein the concentric sleeve pipeline comprises an inner pipeline and an outer pipeline, and the inner pipeline and the outer pipeline are used for pumping air out of the container body and injecting gas into the container body respectively.

2. The FOSB of claim 1, wherein the gas comprises an inert gas.

3. The FOSB of claim 1, wherein the gas comprises nitrogen.

4. A method of operating a front opening shipping box (FOSB), comprising the steps of:
    providing a front opening shipping box (FOSB) having at least a container body and at least a concentric sleeve pipeline, wherein the FOSB has at least an opening, and the concentric sleeve pipeline is disposed on the surface of the container body and linked to the container body through the opening, and furthermore, the concentric sleeve pipeline comprises an inner pipeline and an outer pipeline;
    loading a number of wafers into the container body; and
    pumping air out of the container body and injecting a gas into the container body simultaneously through the inner pipeline and the outer pipeline of the concentric sleeve pipeline.

5. The method of operating the FOSB of claim 4, wherein the gas flow rate is between 0 to 10 1/sec.

6. The method of operating the FOSB of claim 4, wherein the pressure inside the container body is between $-1$ to $5$ $kg/cm^2$.

7. The method of operating the FOSB of claim 4, wherein the interval of time for injecting the gas into the container body is between 1 sec to 30 min.

8. The method of operating the FOSB of claim 4, the gas comprises an inert gas.

9. The method of operating the FOSB of claim 4, the gas comprises nitrogen.

* * * * *